US011639547B2

(12) United States Patent
Goradia et al.

(10) Patent No.: US 11,639,547 B2
(45) Date of Patent: May 2, 2023

(54) HALOGEN RESISTANT COATINGS AND METHODS OF MAKING AND USING THEREOF

(71) Applicant: Applied Materials, Inc., Santa Clara, CA (US)

(72) Inventors: Prerna Goradia, Mumbai (IN); Jennifer Y. Sun, Santa Clara, CA (US); Xiaowei Wu, Santa Clara, CA (US); Geetika Bajaj, Mumbai (IN); Atul Chaudhari, Mumbai (IN); Ankur Kadam, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 114 days.

(21) Appl. No.: 16/401,467

(22) Filed: May 2, 2019

(65) Prior Publication Data

US 2019/0338418 A1 Nov. 7, 2019

(30) Foreign Application Priority Data

May 3, 2018 (IN) .......................... IN201841016725

(51) Int. Cl.
| | | |
|---|---|---|
| *C23C 16/44* | (2006.01) |
| *C23C 16/455* | (2006.01) |
| *H01J 37/32* | (2006.01) |
| *C23C 16/18* | (2006.01) |
| *C23C 16/27* | (2006.01) |
| *C23C 16/40* | (2006.01) |

(52) U.S. Cl.
CPC .......... *C23C 16/4404* (2013.01); *C23C 16/18* (2013.01); *C23C 16/277* (2013.01); *C23C 16/405* (2013.01); *C23C 16/45529* (2013.01); *C23C 16/45544* (2013.01); *H01J 37/32477* (2013.01)

(58) Field of Classification Search
None
See application file for complete search history.

(56) References Cited

U.S. PATENT DOCUMENTS

| 10,975,469 | B2* | 4/2021 | Firouzdor | ......... C23C 16/45527 |
| 2004/0191545 | A1* | 9/2004 | Han | ....................... C23C 28/34 |
| | | | | 428/472 |
| 2006/0040508 | A1* | 2/2006 | Ji | ....................... C23C 16/4404 |
| | | | | 438/758 |
| 2006/0051602 | A1* | 3/2006 | Iacovangelo | ........... C04B 41/52 |
| | | | | 427/248.1 |

(Continued)

OTHER PUBLICATIONS

Rossnagel, et al., "Plasma-enhanced atomic layer deposition of Ta and Ti for interconnect diffusion barriers," J. Vac. Sci. Technol. B. Microelectronics and Nanometer Structures, August 200, vol. 18, No. 4, pp. 2016-2220.

*Primary Examiner* — Karla A Moore
(74) *Attorney, Agent, or Firm* — Lowenstein Sandler LLP

(57) ABSTRACT

Described herein are articles, systems and methods where a halogen resistant coating is deposited onto a surface of a chamber component using an atomic layer deposition (ALD) process. The halogen resistant coating has an optional amorphous seed layer and a transition metal-containing layer. The halogen resistant coating uniformly covers features of the chamber component, such as those having an aspect ratio of about 3:1 to about 300:1.

20 Claims, 11 Drawing Sheets

(56) References Cited

U.S. PATENT DOCUMENTS

| | | | |
|---|---|---|---|
| 2008/0107825 A1* | 5/2008 | Ishizaka | H01L 21/76843 427/578 |
| 2009/0071407 A1* | 3/2009 | Kuznetsov | C23C 16/45565 118/728 |
| 2009/0194233 A1* | 8/2009 | Tamura | C23C 16/45561 156/345.1 |
| 2013/0064973 A1* | 3/2013 | Chen | C23C 16/405 427/248.1 |
| 2018/0044800 A1* | 2/2018 | Hendrix | C23C 16/4404 |
| 2019/0185997 A1* | 6/2019 | Lin | C23C 16/45529 |

* cited by examiner

HALOGEN RESISTANT COATINGS AND METHODS OF MAKING AND USING THEREOF

CROSS REFERENCE TO RELATED APPLICATION(S)

This application claims the benefit of Indian Patent Application No. 201841016725, filed May 3, 2018, the disclosure of which is hereby incorporated by reference herein in its entirety.

TECHNICAL FIELD

Embodiments of the present disclosure relate to articles, coated chamber components and methods of coating chamber components with a halogen resistant coating. The halogen resistant coating may have a transition metal-containing layer (e.g., tantalum, titanium or niobium) and an optional seed layer wherein the transition metal-containing layer is deposited on a surface of the component or on the seed layer. Each layer of the coating may be formed using atomic layer deposition or a pulsed chemical vapor deposition process.

BACKGROUND

Various manufacturing processes expose semiconductor process chamber components to high temperatures, high energy plasma, a mixture of corrosive halogen gases, high stress, and combinations thereof. These extreme conditions may erode and/or corrode the chamber components, increasing the chamber components' susceptibility to defects. It is desirable to reduce these defects and improve the components' erosion and/or corrosion resistance in such extreme environments.

Protective coatings are typically deposited on chamber components by a variety of methods, such as thermal spray, sputtering, ion assisted deposition (IAD), plasma spray or evaporation techniques. These techniques cannot deposit coatings into certain features of the chamber components that have an aspect ratio (e.g., of length to diameter or depth to width) of about 10:1 to about 300:1 (e.g., the inside of a gas line). In some cases special fixtures must be used to direct the precursor gases into the high aspect ratio features of components, which can result in poor quality films, and/or a non-conformal films.

SUMMARY

Some of the embodiments described herein cover a chamber component having a halogen resistant coating on a surface of a portion of the chamber component. The halogen resistant coating can include a transition metal-containing layer having a thickness of about 10 nm to about 1.5 µm, wherein the transition metal-containing layer includes a material selected from tantalum, titanium, niobium, alloys thereof, alloys of tantalum or titanium with a rare earth metal and combinations thereof. The halogen resistant coating may uniformly cover the portion.

According to other embodiments, also described is a method comprising depositing a halogen resistant coating onto a surface of a chamber component using an atomic layer deposition process. The method includes depositing a transition metal-containing layer using atomic layer deposition to a thickness of about 10 nm to about 1.5 µm, wherein the transition metal-containing layer comprises a material selected from tantalum, titanium, niobium, alloys thereof, alloys of tantalum or titanium with a rare earth metal and combinations thereof. The halogen resistant coating may conformally cover the surface of the chamber component.

According to certain embodiments, described herein is a method comprising depositing a halogen resistant coating onto an inside surface of a gas line using an atomic layer deposition process. The method includes depositing an optional seed layer on the surface using atomic layer deposition to a thickness of about 1 nm to about 1.5 µm and depositing a transition metal-containing layer on the optional seed layer using atomic layer deposition to a thickness of about 10 nm to about 1.5 µm, wherein the transition metal-containing layer includes a material selected from tantalum, titanium, niobium, alloys thereof, alloys of tantalum or titanium with a rare earth metal and combinations thereof. The gas line may have an aspect ratio of length to diameter of about 3:1 to about 300:1.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
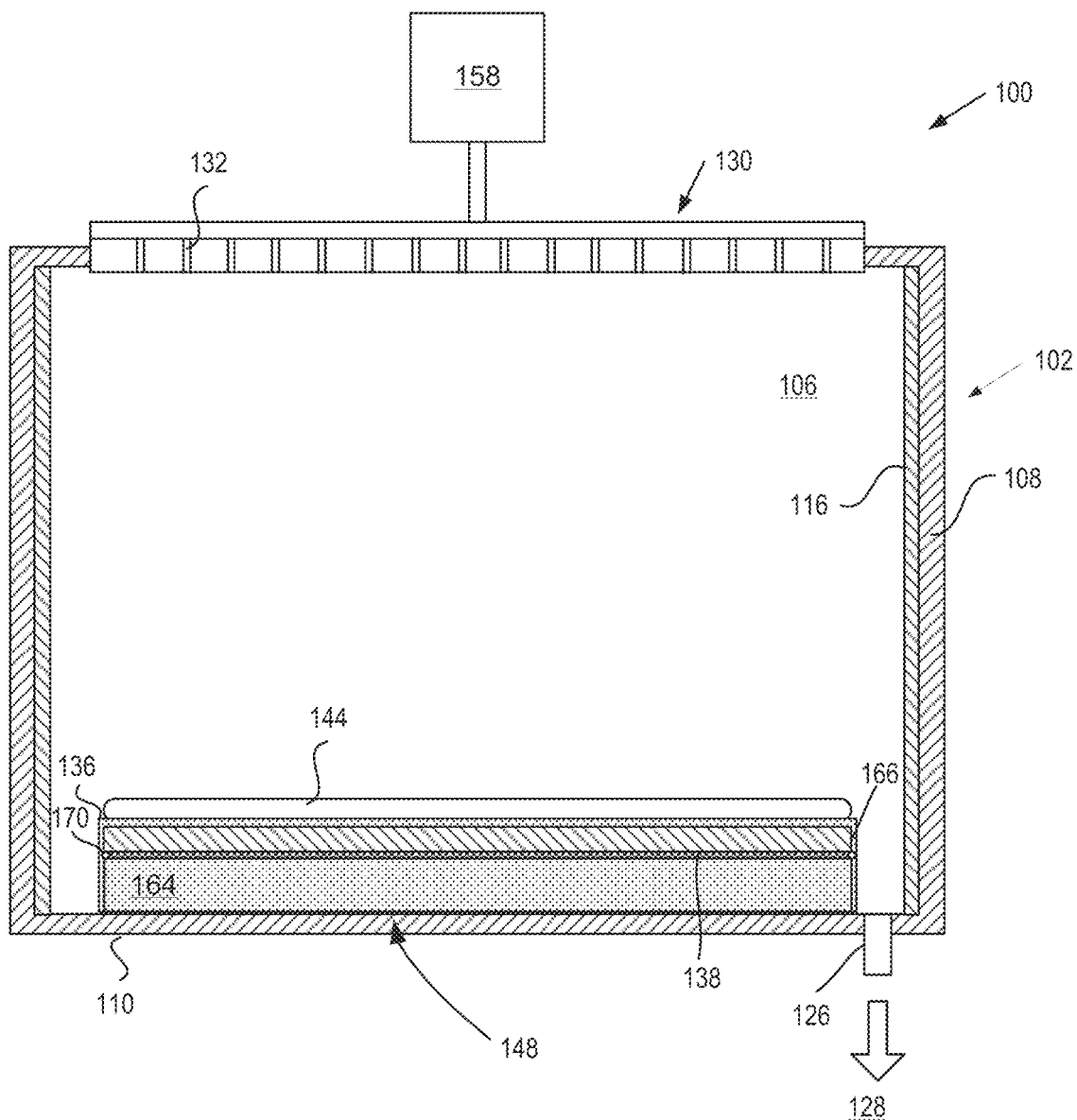
FIG. 1 depicts a sectional view of a processing chamber.

Embodiments described herein relate to articles, coated chamber components and methods where a halogen resistant coating having an optional seed layer and a transition metal-containing layer, such as a tantalum, titanium or niobium layer, are deposited onto a surface of the components. The methods of forming the transition metal-containing coatings may employ low temperature transition metal deposition by atomic layer deposition (ALD) (for low-k dielectrics), for example, plasma enhanced ALD or pulsed chemical vapor deposition (CVD). The compositional and protective properties of the coatings formed by ALD or pulsed CVD can be tailored by varying parameters such as the type and composition of the precursor gases, the number of applied ALD layers, the thickness of each different layer (which is controlled by the number of cycles), and the temperature, which may yield amorphous or crystalline phases. In certain embodiments, the transition metal is tantalum, which forms a natural oxide film on its surface, and results in a high resistance to corrosion by etching chemistries including sulfuric and hydrochloric acids. Coatings as described herein can have thin, multilayered ALD structures and/or hybrid ALD multilayered structures. Tantalum deposited films as described herein may be amorphous and useful as diffusion barriers. The primary interdiffusion pathway through a semiconductor film is via grain boundary diffusion or defect diffusion, rather than by bulk diffusion. Amorphous materials may be considered superior to polycrystalline materials because of their lack of grain boundaries. Also disclosed herein are methods for oxidation of the deposited metal and its alloys using oxidation methods such as plasma, steam, etc.

As used herein, the term "halogen resistant" means resistant to erosion and corrosion caused by halogen etch chemistries (e.g., fluorine, chlorine, chlorine trifluoride, dichlorosilane and sulfur hexafluoride) and radicals. The surface may be an aluminum (e.g., Al 6061, Al 6063) or ceramic material. The halogen resistant coating may be comprised of a bi-layer stack. The bi-layer or multilayer stack may include a seed layer of hydrogen (H), such as hydrogen radicals, and a transition metal-containing layer. Embodiments herein are described with a tantalum-containing layer as an example. The stack may further include an additional transition metal or rare earth metal oxide or single phase or multiple phase mixtures thereof (e.g., containing yttrium). Examples of other transition metal-containing layers that may be used in addition to or instead of the described tantalum-containing layer includes titanium-containing layers and niobium-containing layers. The resulting coatings are resistant to corrosion by halogen-based etching chemistries and can be formed using a low temperature (e.g., about 250° C. or less) ALD or pulsed CVD process. Performing the ALD process at such low temperatures enables deposition of transition metal-containing coatings on materials such as stainless steel and aluminum.

The thickness of each layer in the multi-layer halogen resistant coating may be from about 1 nm to about 1.5 μm, or about 5 nm to about 1.0 μm, or about 10 nm to about 0.5 μm, or about 20 nm to about 0.1 μm. In embodiments, the seed layer may have a thickness of about 1.0 nm to about 1.0 μm and the transition metal-containing layer may have a thickness of about 50 nm. A ratio of the transition metal-containing layer thickness to the seed layer thickness may be about 200:1 to about 1:200, or about 150:1 to about 1:150, or about 100:1 to about 1:100, or about 75:1 to about 1:75, or about 50:1 to about 1:50, or about 25:1 to about 1:25, or about 15:1 to about 1:15, or about 8:1 to about 1:8. The thickness ratio may be selected in accordance with specific chamber applications. The coating may be annealed in order to create one, or more than one, intermediate layer containing an interdiffused solid state phase between the two layers. The halogen resistant coating may coat or cover the surfaces of features in the article having an aspect ratio of about 3:1 to about 300:1. The halogen resistant coating may also conformally cover such features with a substantially uniform thickness. In one embodiment, the halogen resistant coating has a conformal coverage of the underlying surface that is coated (including coated surface features) with a uniform thickness having a thickness variation of less than about +/−20%, a thickness variation of +/−10%, a thickness variation of +/−5%, or a lower thickness variation.

Embodiments described herein enable high aspect ratio features of chamber components and other articles to be effectively coated with halogen resistant coatings having an optional seed layer (e.g., formed from hydrogen radicals) and a transition metal-containing layer such as a tantalum-, titanium- or niobium-containing layer thereon. The halogen resistant coatings are conformal within the high aspect ratio feature and may cover the feature with a substantially uniform coating (e.g., with a thickness variation of about +/−5% or less). The halogen resistant coating is also very dense with a porosity of about 0% (e.g., the halogen resistant coating may be porosity-free in embodiments). The halogen resistant coatings may be resistant to corrosion and erosion from halogen etch chemistries, such as carbon tetrachloride ($CCl_4$) and fluoroform ($CHF_3$) plasma etch chemistries, trichlorosilane ($HCl_3Si$) etch chemistries and nitrogen trifluoride ($NF_3$) etch chemistries. Additionally, the halogen resistant coatings described herein having the optional seed layer and the transition metal-containing layer may be resistant to cracking and delamination at temperatures up to about 400° C. For example, a chamber component having the halogen resistant coating described herein may be used in processes that include heating to temperatures of about 400° C. The chamber component may be thermally cycled between room temperature and the temperature of about 400° C. without introducing any cracks or delamination in the halogen resistant coating.

ALD or pulsed CVD allow for a controlled self-limiting deposition of material through chemical reactions with the surface of the article. Aside from being a conformal process, ALD and pulsed CVD are also uniform processes. All exposed sides of the article, including high aspect ratio features (e.g., having a length to diameter or a depth to width of about 10:1 to about 300:1) will have the same or approximately the same amount of material deposited. A typical reaction cycle of an ALD process starts with a precursor (i.e., a single chemical A) flooded into an ALD chamber and adsorbed onto the surface of the article. The excess precursor is then flushed out of the ALD chamber before a reactant (i.e., a single chemical R) is introduced into the ALD chamber and subsequently flushed out. The reactant reacts with the adsorbed precursors to form a solid layer before the excess chemicals are flushed out. For ALD, the final thickness of material is dependent on the number of reaction cycles that are run, because each reaction cycle will grow a layer of a certain thickness that may be one atomic layer or a fraction of an atomic layer.

Unlike other techniques typically used to deposit coatings on components having high aspect ratio features, such as plasma spray coating and ion assisted deposition, the ALD or pulsed CVD techniques can deposit a layer of material within such features (i.e., on the surfaces of the features). Additionally, the ALD or pulsed CVD techniques produce relatively thin (i.e., 1 μm or less) coatings that are porosity-free (i.e., pin-hole free), which may eliminate crack formation during deposition. The term "porosity-free" as used herein means absence of any pores, pin-holes, voids, or cracks along the whole depth of the coating as measured by transmission electron microscopy (TEM). The TEM may be performed using a 100 nm thick TEM lamella prepared by focused ion beam milling, with the TEM operated at 200 kV in bright-field, dark-field, or high-resolution mode. In contrast, with conventional e-beam IAD or plasma spray techniques, cracks form upon deposition even at thicknesses of 5 μm or 10 μm and the porosity may be 1-3%.

Process chamber components, such as gas lines/channels, chamber walls, shower heads, nozzles, plasma generation units (e.g., radiofrequency electrodes with housings) and diffusers would benefit from having these halogen resistant coatings to protect the components in harsh etch environments. Many of these chamber components have features with aspect ratios (i.e., length:diameter or depth:width) that range from about 10:1 to about 300:1, which makes them difficult to coat well using conventional deposition methods. Embodiments described herein enable articles having high aspect ratio features such as the aforementioned process chamber components to be coated with halogen resistant coatings that protect the articles. For example, embodiments enable the insides of gas lines, the insides of nozzles, the insides of holes in showerheads, and so on to be coated with a halogen resistant coating.

FIG. 1 is a sectional view of a semiconductor processing chamber 100 having one or more chamber components that are coated with a halogen resistant coating that has an optional seed layer and a transition metal-containing layer in accordance with embodiments. The processing chamber 100 may be used for processes in which a corrosive etching environment is provided. For example, the processing chamber 100 may be a chamber for a plasma etcher or plasma etch reactor, a plasma cleaner, plasma enhanced CVD or ALD reactors and so forth. Examples of chamber components that may include the halogen resistant coating include chamber components with complex shapes and holes having high aspect ratios. Some exemplary chamber components include a substrate support assembly 148, an electrostatic chuck (ESC), a ring (e.g., a process kit ring or single ring), a chamber wall, a base, a gas distribution plate, a showerhead of a processing chamber, gas lines, a nozzle, a lid, a liner, a liner kit, a shield, a plasma screen, a flow equalizer, a cooling base, a chamber viewport, a chamber lid, and so on. The halogen resistant coating, which is described in greater detail below, may be applied by ALD. ALD allows for the application of a conformal coating of a substantially uniform thickness that is porosity-free on all types of components including components with complex shapes and features having high aspect ratios.

In one embodiment, the processing chamber 100 includes a chamber body 102 and a showerhead 130 that enclose an interior volume 106. The showerhead 130 may include a showerhead base and a showerhead gas distribution plate. Alternatively, the showerhead 130 may be replaced by a lid and a nozzle in some embodiments, or by multiple pie shaped showerhead compartments and plasma generation units in other embodiments. The chamber body 102 may be fabricated from aluminum, stainless steel or other suitable material. The chamber body 102 generally includes sidewalls 108 and a bottom 110.

An outer liner 116 may be disposed adjacent the sidewalls 108 to protect the chamber body 102. The outer liner 116 may be fabricated and/or coated with a bi-layer coating. In one embodiment, the outer liner 116 is fabricated from aluminum oxide.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewall 108 of the chamber body 102. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 may include a gas distribution plate (GDP) and may have multiple gas delivery holes 132 throughout the GDP. The showerhead 130 may include the GDP bonded to an aluminum base or an anodized aluminum base. The GDP may be made from Si or SiC, or may be a ceramic such as $Y_2O_3$, $Al_2O_3$, $Y_3Al_5O_{12}$ (YAG), and so forth.

For processing chambers used for conductor etch (etching of conductive materials), a lid may be used rather than a showerhead. The lid may include a center nozzle that fits into a center hole of the lid. The lid may be a ceramic such as $Al_2O_3$, $Y_2O_3$, YAG, or a ceramic compound comprising $Y_4Al_2O_9$ and a solid-solution of $Y_2O_3$—$ZrO_2$. The nozzle may also be a ceramic, such as $Y_2O_3$, YAG, or the ceramic compound comprising $Y_4Al_2O_9$ and a solid-solution of $Y_2O_3$—$ZrO_2$.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the showerhead 130 or lid. The substrate support assembly 148 holds a substrate 144 during processing.

An inner liner may be coated on the periphery of the substrate support assembly 148. The inner liner may be a halogen-containing gas resist material such as those discussed with reference to the outer liner 116. In one embodiment, the inner liner may be fabricated from the same materials of the outer liner 116.

In one embodiment, the substrate support assembly 148 is an ESC assembly that includes an electrostatic puck 166 bonded to a thermally conductive base called a cooling base 164 or cooling plate by a bond 138. The bond 138 may be a silicone bond in one embodiment. An o-ring 170 may be disposed around a region of the electrostatic puck 166 and the cooling base 164 at the interface of the electrostatic puck 166 and the cooling base 164. The o-ring 170 may protect the bond 138 from erosion and/or may provide a seal. An upper surface of the electrostatic puck 166 may be covered by the halogen resistant coating 136. Alternatively, all of the exposed portions of the substrate support assembly 148, including exposed portions of the electrostatic puck 166, the cooling plate 164, the o-ring 170, and so on. For example, the halogen resistant coating 136 may be disposed on the entire exposed surface of the ESC assembly including the outer and side periphery of the cooling base 164 and the top and sides of the electrostatic puck 166 as well as any other exposed geometrically complex parts or holes having large aspect ratios in the electrostatic chuck assembly.

The cooling plate 164 and/or electrostatic puck 166 may include one or more optional embedded heating elements, embedded thermal isolators and/or conduits to control a lateral temperature profile of the substrate support assembly 148. The conduits may be fluidly coupled to a fluid source that circulates a temperature regulating fluid through the conduits. The embedded isolator may be disposed between the conduits in one embodiment. The heater is regulated by a heater power source. The conduits and heater may be utilized to control the temperature of the cooling plate 164. The conduits and heater heat and/or cool the electrostatic puck 166 and a substrate (e.g., a wafer) 144 being processed. The temperature of the electrostatic puck 166 and the cooling plate 164 may be monitored using a plurality of temperature sensors which may be monitored using a controller.

The electrostatic puck 166 may further include multiple gas passages such as grooves, mesas and other surface features that may be formed in an upper surface of the electrostatic puck 166. The gas passages may be fluidly coupled to a source of a heat transfer (or backside) gas such as He via holes drilled in the electrostatic puck 166. In operation, the backside gas may be provided at controlled pressure into the gas passages to enhance the heat transfer between the electrostatic puck 166 and the substrate 144. The He via holes may be plugged by porous ceramic plugs (not shown) that are permeable to the He. The porous ceramic plugs may also be at least partially permeable to corrosive gases and plasmas that are used to clean the semiconductor processing chamber 100. The porous ceramic plugs may filter gas particles of the corrosive gases and prevent such corrosive gases from penetrating into the substrate support assembly. The porous ceramic plugs may additionally prevent a secondary plasma from forming within the He vias in the electrostatic puck 166.

The electrostatic puck 166 includes at least one clamping electrode (not shown) controlled by a chucking power source. The clamping electrode (or other electrode disposed in the electrostatic puck 166 or cooling plate 164) may further be coupled to one or more RF power sources through a matching circuit for maintaining a plasma formed from process and/or other gases within the processing chamber 100.

Figure 2A:
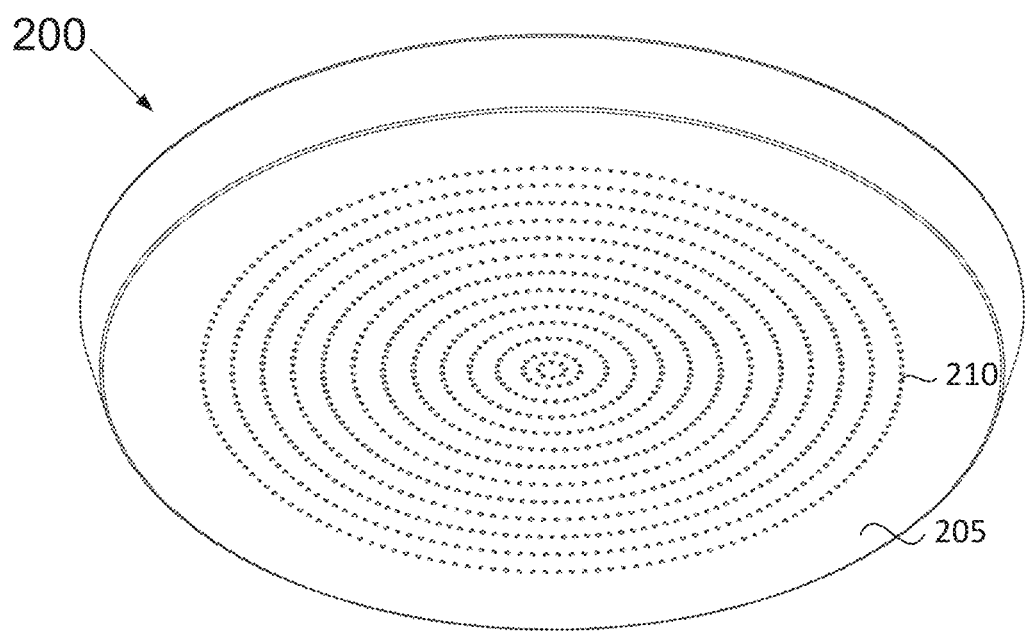
FIG. 2A depicts a showerhead chamber component, in accordance with embodiments.

FIG. 2A illustrates a bottom view of a showerhead 200. The showerhead example provided below is just an exemplary chamber component whose performance may be improved by the use of the halogen resistant coating as set forth in embodiments herein. It is to be understood that the performance of other chamber components may also be improved when coated with the halogen resistant coating disclosed herein. The showerhead 200, as depicted here, was chosen as an illustration of a semiconductor process chamber component having a surface with complex geometry and holes with high aspect ratios.

The complex geometry of lower surface 205 may receive a halogen resistant coating according to embodiments herein. Lower surface 205 of showerhead 200 defines gas conduits 210 arranged in evenly distributed concentric rings. In other embodiments, gas conduits 210 may be configured in alternative geometric configurations and may have as many or as few gas conduits as needed depending on the type of reactor and/or process utilized. The halogen resistant coating is grown or deposited on surface 205 and in gas conduit holes 210 using the ALD technique which enables a conformal coating of relatively uniform thickness and zero porosity (i.e., porosity-free) on the surface as well as in the gas conduit holes despite the complex geometry and the large aspect ratios of the holes.

Showerhead 200 may be exposed to corrosive halogen-containing chemistries such as fluorine and may erode due to plasma interaction with the showerhead. The halogen resistant coating may reduce such plasma interactions and improve the showerhead's durability. A conformal coating enhances surfaces exposed to plasma as the coated/uncoated boundaries are prone to arcing in a capacitive-couple plasma environment. The halogen resistant coating deposited with ALD maintains the relative shape and geometric configuration of the lower surface 205 and of the gas conduits 210 so as to not disturb the functionality of the showerhead. Similarly, when applied to other chamber components, the halogen resistant coating may maintain the shape and geometric configuration of the surface it is intended to coat so as to not disturb the component's functionality, provide plasma resistance, and improve erosion and/or corrosion resistance throughout the entire surface.

The resistance of the coating material to halogen chemistries (e.g., halogen-containing plasmas) is measured through "etch rate" (ER), which may have units of micron/hour (μm/hr), throughout the duration of the coated components' operation and exposure to halogen chemistry. Measurements may be taken after different processing times. For example, measurements may be taken before processing, after 50 processing hours, after 150 processing hours, after 200 processing hours, and so on. Variations in the composition of the halogen resistant coating grown or deposited on the showerhead or on any other process chamber component may result in multiple different plasma resistances or erosion rate values. Additionally, a halogen resistant coating with a single composition exposed to various plasmas could have multiple different plasma resistances or erosion rate values. For example, a plasma resistant material may have a first plasma resistance or erosion rate associated with a first type of plasma and a second plasma resistance or erosion rate associated with a second type of plasma. In embodiments, no detectable etching occurred after exposure to a 200 W $NF_3$ direct plasma at 500° C. for 1 hours.

Figure 2B:
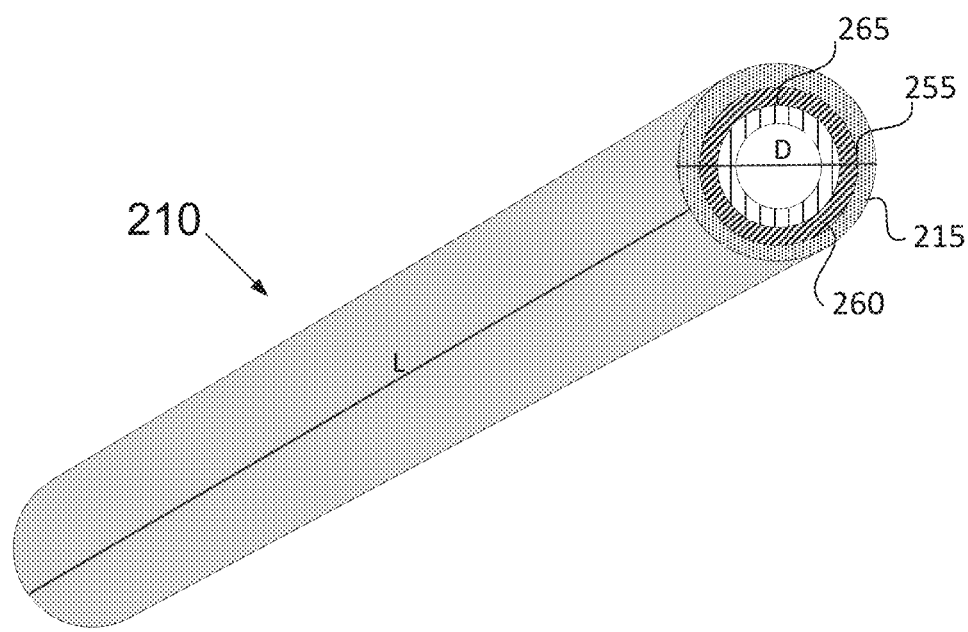
FIG. 2B depicts a blown up view of a gas conduit, wherein an interior of the gas conduit is coated with a halogen resistant coating as described herein.

FIG. 2B depicts a blown up view of a gas conduit 210 having a high aspect ratio coated according to an embodiment. Gas conduit 210 may have a length L and a diameter D. Gas conduit 210 may have a high aspect ratio defined as length to diameter (L:D) or depth to width (D:W), wherein the aspect ratio may range from about 10:1 to about 300:1. In some embodiments, the aspect ratio may be about 50:1 to about 100:1.

Gas conduit 210 may have an interior surface 255 which may be coated with a halogen resistant coating. The halogen resistant coating may comprise a seed layer 260 and a transition metal-containing layer 265. The seed layer 260 may be formed from hydrogen radicals. The transition metal-containing layer 265 may include titanium, tantalum, niobium, combinations thereof and alloys thereof. The transition metal-containing layer 265 may have any rare earth metal-containing material such as those described herein above. Each layer may be coated using an ALD process. The ALD process may grow conformal coating layers of uniform thickness that are porosity-free throughout the interior surface of gas conduit 210 despite its high aspect ratio while ensuring that the final multi-component coating may also be thin enough so as to not plug the gas conduits in the showerhead.

In some embodiments, each layer may comprise monolayers or thin layers of uniform thickness. Each monolayer or thin layer may have a thickness ranging from about 0.1 nanometers to about 100 nanometers. In other embodiments, the layers may comprise thick layers of uniform thickness. Each thick layer may have a thickness ranging from about 100 nanometers to about 1.5 micrometer. In yet other embodiments, the layers may comprise a combination of monolayers, thin layers and/or thick layers.

Figure 2C:
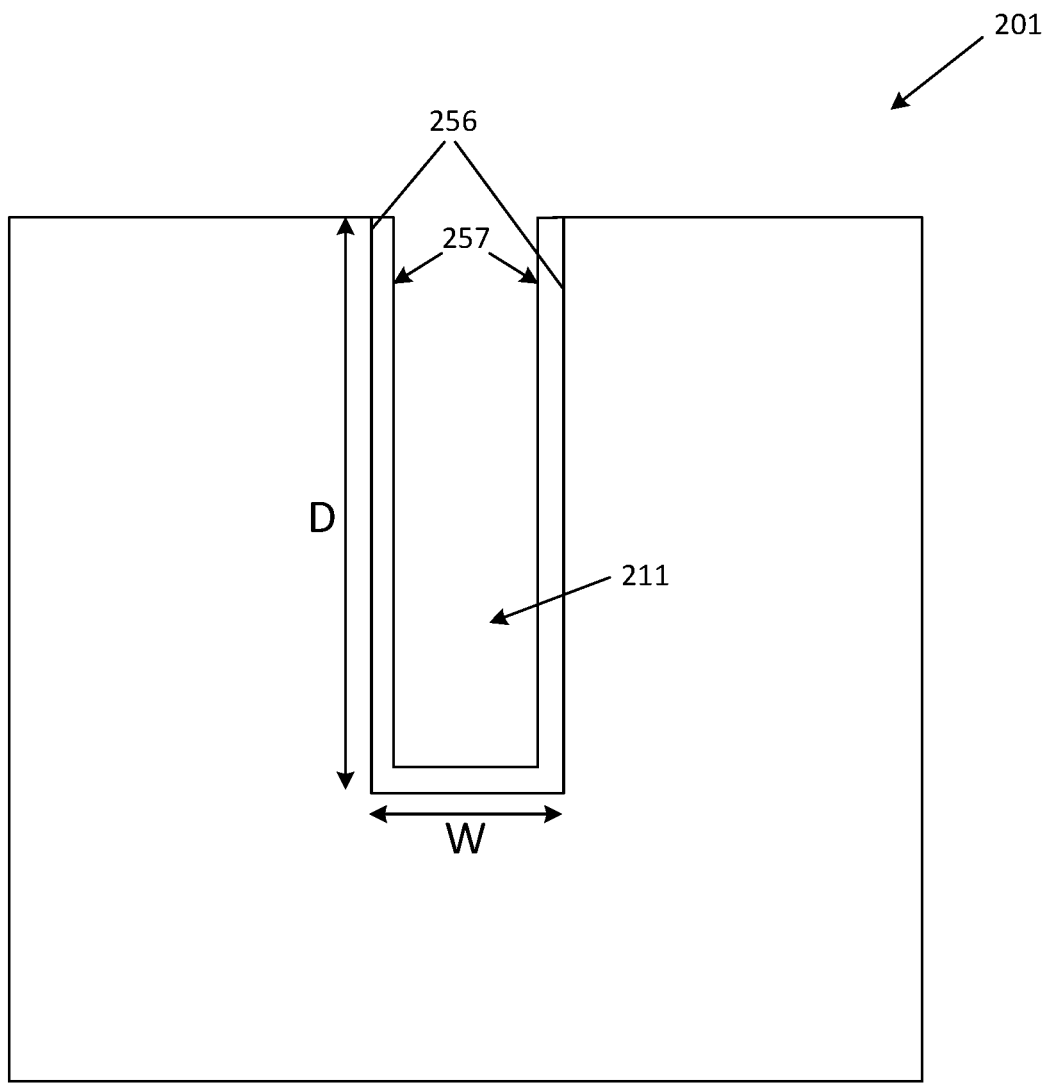
FIG. 2C depicts a portion of a chamber component having a trough, wherein an interior of the trough is coated with a halogen resistant coating as described herein.

FIG. 2C depicts a portion of a chamber component 201 having trough 211. Trough 211 may have a depth D and a width W. Trough 211 may have a high aspect ratio defined as depth to width (D:W), wherein the aspect ratio may range from about 3:1 to about 300:1.

Trough 211 may have a surface 256 coated with a halogen resistant coating 257 according to embodiments described herein. For example, the halogen resistant coating 257 may comprise a transition metal-containing layer, for example, having a thickness of about 10 nm to about 1.5 µm. The transition metal-containing layer may include titanium, tantalum, niobium, alloys thereof, alloys of tantalum or titanium with a rare earth metal and combinations thereof. The halogen resistant coating 257 may uniformly cover the surface of the trough 211.

Figure 3A:
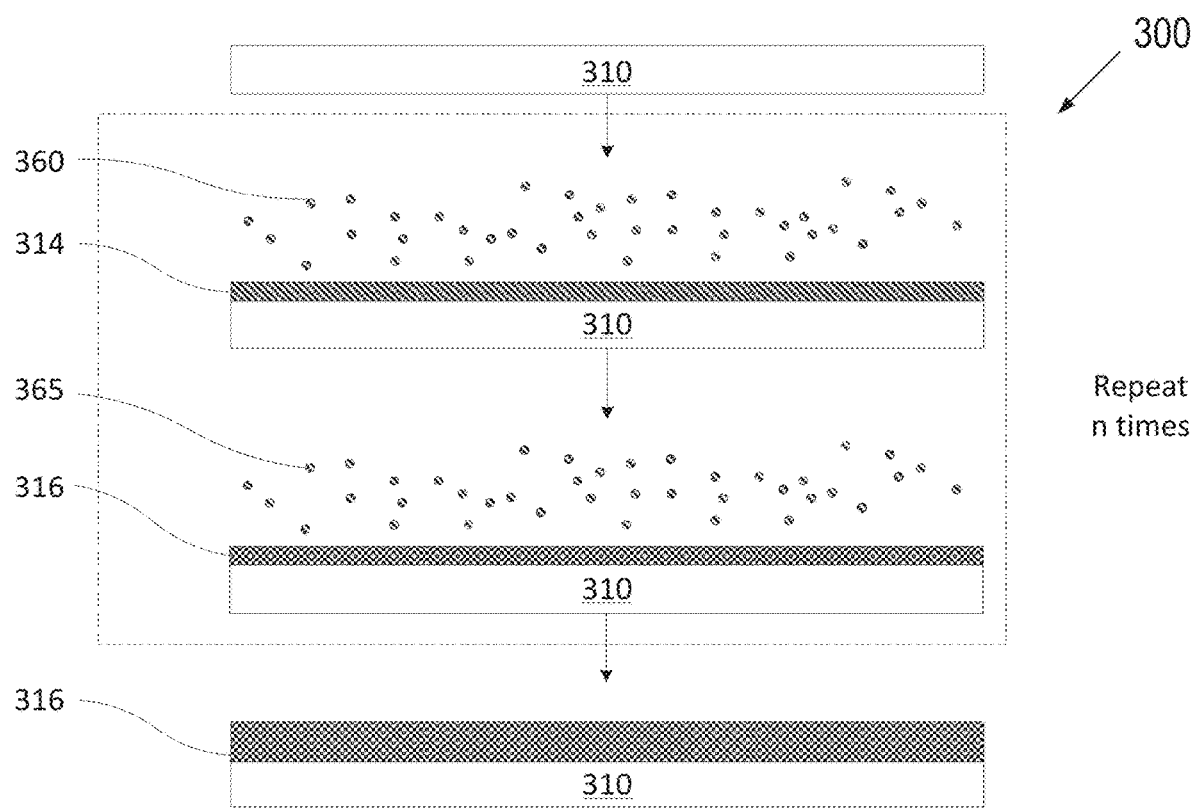
FIG. 3A depicts one embodiment of a deposition process in accordance with an atomic layer deposition technique as described herein.
Figure 3B:
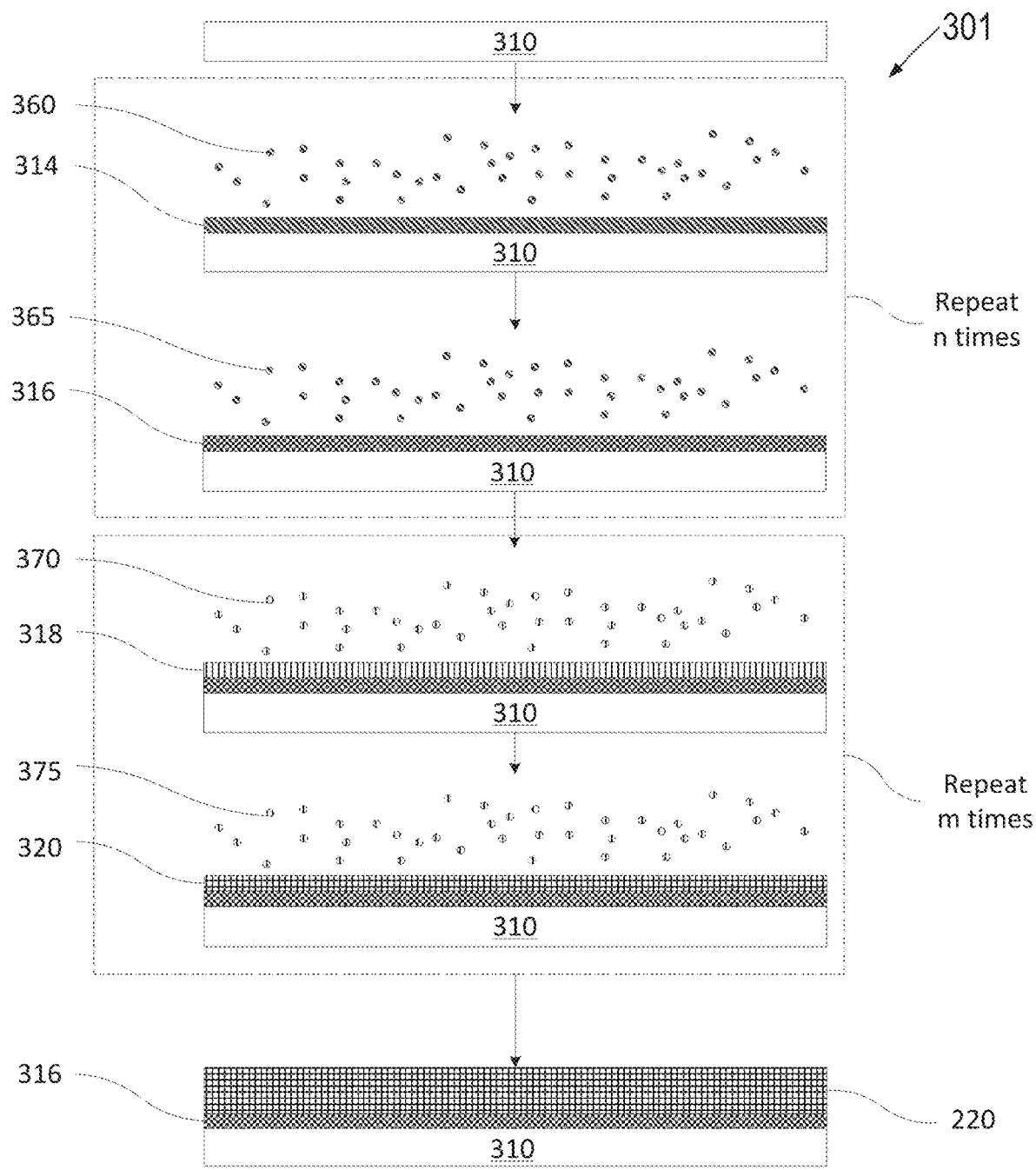
FIG. 3B depicts another embodiment of a deposition process in accordance with an atomic layer deposition technique as described herein.
Figure 3C:
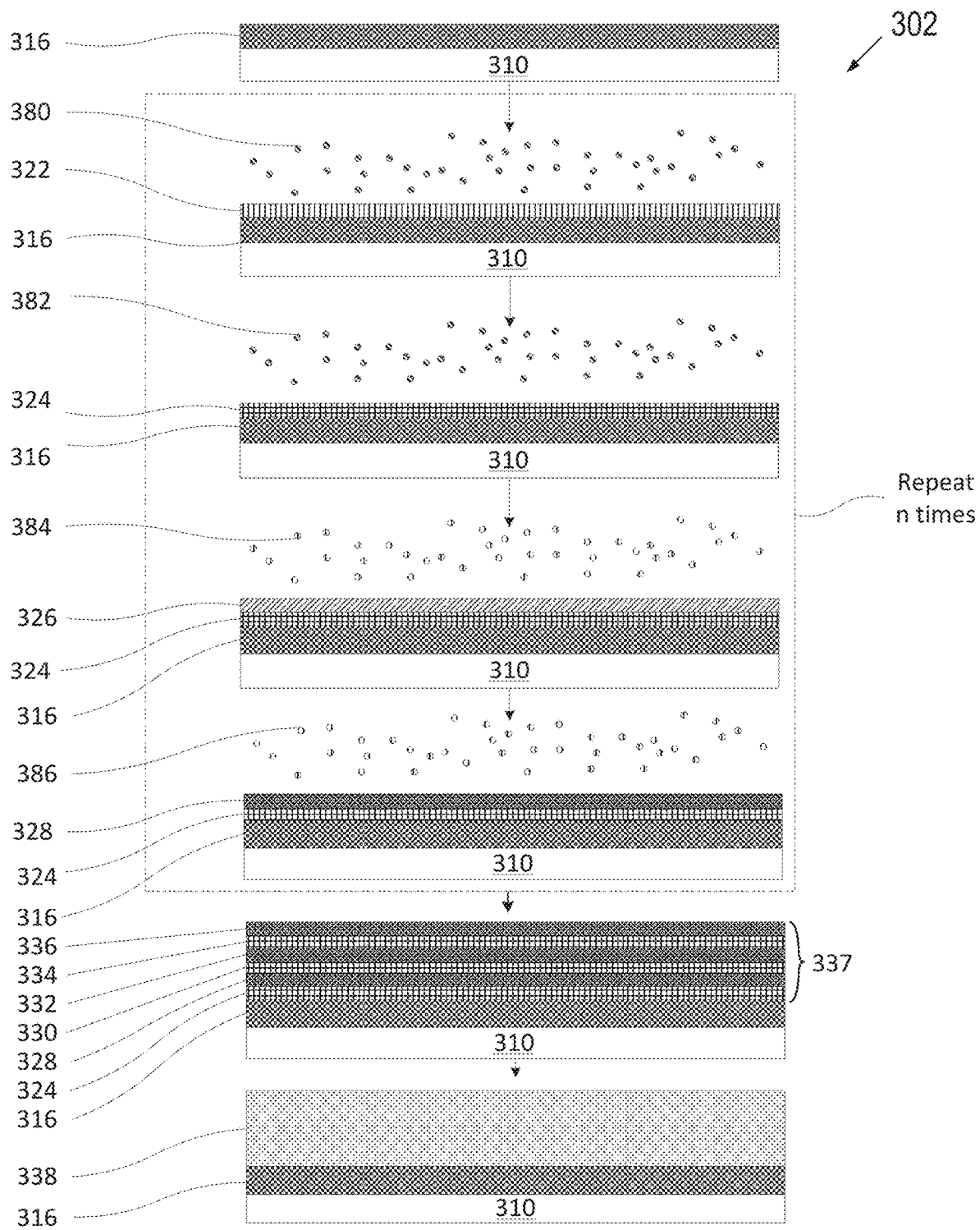
FIG. 3C depicts another embodiment of a deposition process in accordance with an atomic layer deposition technique as described herein.

FIG. 3A depicts one embodiment of a deposition process in accordance with an ALD technique to grow or deposit a halogen resistant coating on an article (including within the inner surface of a gas line having a high aspect ratio). FIG. 3B depicts one embodiment of a deposition process in accordance with an ALD technique to grow or deposit a multi-layer plasma resistant coating on an article (including on an insulator material of a component and pore walls within a porous material). FIG. 3C depicts another embodiment of a deposition process in accordance with an atomic layer deposition technique as described herein.

Various types of ALD processes exist and the specific type may be selected based on several factors such as the surface to be coated, the coating material, chemical interaction between the surface and the coating material, etc. The general principle for the various ALD processes comprises growing a thin film layer by repeatedly exposing the surface to be coated to pulses of gaseous chemical precursors that chemically react with the surface one at a time in a self-limiting manner. In one embodiment, plasma enhanced ALD is performed to form the halogen resistant coating.

FIGS. 3A-3C illustrate an article 310 having a surface. Article 310 may represent various semiconductor process chamber components including, but not limited to, an inner surface of a gas line, a hole or chamber walls. The article 310 may be made from a dielectric material such as a ceramic, a metal-ceramic composite (such as $Al_2O_3/SiO_2$, $Al_2O_3/MgO/SiO_2$, SiC, $Si_3N_4$, $AlN/SiO_2$ and the like), a metal (such as aluminum, stainless steel), or a polymer such as a crosslinked polystyrene (e.g., Rexolite®) or a polymer ceramic composite, mylar, polyester, or other suitable materials, and may further comprise materials such as AlN, Si, SiC, $Al_2O_3$, $SiO_2$, and so on. In one embodiment, the article 310 is a gas line in a process chamber.

For ALD, either adsorption of a precursor onto a surface or a reaction of a reactant with the adsorbed precursor may be referred to as a "half-reaction." During a first half reaction, a precursor is pulsed onto the surface of the article 310 (including onto a surface of pore walls within the article 310) for a period of time sufficient to allow the precursor to fully adsorb onto the surface. The adsorption is self-limiting as the precursor will adsorb onto a finite number of available sites on the surface, forming a uniform continuous adsorption layer on the surface. Any sites that have already adsorbed with a precursor will become unavailable for further adsorption with the same precursor unless and/or until the adsorbed sites are subjected to a treatment that will form new available sites on the uniform continuous coating. Exemplary treatments may be plasma treatment, treatment by exposing the uniform continuous adsorption layer to radicals, or introduction of a different precursor able to react with the most recent uniform continuous layer adsorbed to the surface.

In FIG. 3A, article 310, may be optionally pre-treated with a seed layer (not shown). The seed layer may be deposited using atomic layer deposition. The seed layer facilitates adhesion between the substrate (typically stainless steel or aluminum) and the transition metal-containing film. The seed layer may be formed using a hydrogen radical precursor.

The optionally pre-treated article 310 may be introduced to a first precursor 360 for a first duration until a surface of article 310 is fully adsorbed with the first precursor 360 to form an adsorption layer 314. Subsequently, article 310 may be introduced to a first reactant 365 to react with the adsorption layer 314 to grow a solid layer 316 (e.g., so that the layer 316 is fully grown or deposited, where the terms grown and deposited may be used interchangeably herein). The first precursor 360 may be a precursor for a transition metal, for example, $TiCl_4$, $TaCl_5$, $TaF_5$, $TaBr_5$. The first reactant 365 may be hydrogen (e.g., hydrogen radicals). Accordingly, ALD may be used to form the layer 316. The layer 316 may be a halogen resistant coating, or may be one layer of a bi- or multi-layer halogen resistant coating.

In an example where the layer 316 is a tantalum layer, article 310 (e.g., the inner surface of a gas line, a hole, a chamber wall, etc.) may be introduced to a first precursor 360 (e.g., tantalum (V) chloride—$TaCl_5$ as a white solid, melting point 216° C. and boiling point 239° C.) for a first duration until all the reactive sites on the article's surfaces (or the seed layer's surfaces) are consumed. The wall temperature during the process may be maintained at about 25° C. to about 200° C. The remaining first precursor 360 is flushed away and then a first reactant 365 of hydrogen radicals is injected into the reactor to start the second half cycle. A layer 316 of tantalum is formed after the hydrogen radicals react with the tantalum adsorption layer created by the first half reaction. The surface chemistry may be expressed as:

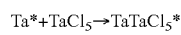

$$Ta^* + TaCl_5 \rightarrow TaTaCl_5^*$$

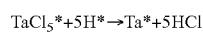

$$TaCl_5^* + 5H^* \rightarrow Ta^* + 5HCl$$

Where layer 316 is a titanium layer, first precursor 360 may be $TiCl_4$. In some embodiments, the tantalum or titanium coatings may be formed as alloys with a rare earth metal.

Layer 316 may be uniform, continuous and conformal. Layer 316 may be porosity free (e.g., have a porosity of zero) or have an approximately zero porosity in embodiments (e.g., a porosity of 0% to 0.01%). Layer 316 may have a thickness of less than one atomic layer to a few atoms in some embodiments after a single ALD deposition cycle. Some metalorganic precursor molecules are large. After reacting with the reactant 365, large organic ligands may be gone, leaving much smaller metal atoms. One full ALD cycle (e.g., that includes introduction of precursors 360 followed by introduction of reactants 365) may result in less than a single atomic layer. For example, a tantalum monolayer grown by $TaCl_5$ and H typically has a growth rate of about 0.16 Å/cycle to about 0.5 Å/cycle.

Multiple full ALD deposition cycles may be implemented to deposit a thicker layer 316, with each full cycle (e.g., including introducing precursor 360, flushing, introducing reactant 365, and again flushing) adding to the thickness by an additional fraction of an atom to a few atoms. As shown, up to n full cycles may be performed to grow the layer 316, where n is an integer value greater than 1. In embodiments, layer 316 may have a thickness of about 5 nm to about 3 µm. In a further embodiment, layer 316 has a thickness of about 5 nm to about 300 nm. Layer 316 may have a thickness of about 10 nm to about 150 nm in embodiments or about 50 nm to about 100 nm in other embodiments.

The layer 316 is a halogen resistant layer that provides robust halogen-based etch chemistry resistance and mechanical properties. Layer 316 may protect the component from corrosion, enhance or maintain dielectric strength, and may prevent cracking of the halogen resistant coating at temperatures up to about 200° C., or up to about 400° C., or from about 200° C. to about 400° C. In further embodiments, the layer 316 may prevent cracking of the halogen resistant coating at temperatures of up to about 350° C. Since ALD is used for the deposition, the internal surfaces of high aspect ratio features such as gas delivery holes in a showerhead or pores in a porous material may be coated, and thus an entirety of a component may be protected from exposure to a corrosive environment.

FIG. 3B describes a deposition process 301 that includes the deposition of layer 316 as described with reference to FIG. 3A. However, the deposition process 301 of FIG. 3B further includes deposition of an additional layer 320 to form a multi-layer halogen resistant coating. Accordingly, after layer 316 is complete, article 310 having layer 316 optionally, may be introduced to an additional one or more precursors 370 for a second duration until layer 316 is fully adsorbed with the one or more additional precursors 370 to form an adsorption layer 318. Subsequently, article 310 may be introduced to a reactant 375 to react with adsorption layer 318 to grow another metal-containing layer 320, also referred to as the second layer 320 for simplicity (e.g., so that the second layer 320 is fully grown or deposited). Accordingly, the second layer 320 is fully grown or deposited over layer 316 using ALD. In an example, precursor 370 may be a transition metal containing precursor or a rare earth metal-containing precursor used in the first half cycle, and reactant 375 may be H or $H_2O$ used in the second half cycle.

In one embodiment, the second layer 320 may form an optional yttrium-containing oxide layer or other rare-earth metal-containing oxide layer, which may be uniform, continuous and conformal. The second layer 320 may form an optional transition metal-containing layer wherein the transition metal of the second layer 320 differs from that of the first layer 316. The second layer 320 may have a very low porosity of less than 1% in embodiments, and less than 0.1% in further embodiments, and about 0% in embodiments or porosity-free in still further embodiments. Second layer 220 may have a thickness of less than an atom to a few atoms (e.g., 2-3 atoms) after a single full ALD deposition cycle. Multiple ALD deposition stages may be implemented to deposit a thicker second layer 320, with each stage adding to the thickness by an additional fraction of an atom to a few atoms. As shown, the full deposition cycle may be repeated m times to cause the second layer 320 to have a target thickness, where m is an integer value greater than 1. In embodiments, second layer 320 may have a thickness of about 5 nm to about 3 µm. In other embodiments, second layer 320 may have a thickness of about 5 nm to about 300 nm. Second layer 320 may have a thickness of about 10 nm to about 20 nm in embodiments or about 50 nm to about 60 nm in some embodiments. In other embodiments, second layer 320 may have a thickness of about 90 nm to about 110 nm.

A ratio of the second layer 320 thickness to the layer 316 thickness may be 200:1 to 1:200. A higher ratio of the second layer 320 thickness to the layer 316 thickness (e.g., 200:1, 100:1, 50:1, 20:1, 10:1, 5:1, 2:1 etc.) provides better corrosion and erosion resistance, while a lower ratio of the second layer 320 thickness to the layer 316 thickness (e.g., 1:2, 1:5, 1:10, 1:20, 1:50, 1:100, 1:200) provides better heat resistance (e.g., improved resistance to cracking and/or delamination caused by thermal cycling).

Second layer 320 may be a transition metal selected from tantalum, titanium or niobium, or second layer 320 may be a rare-earth metal-containing oxide layer. For example, second layer 320 may be $Y_2O_3$, alone or in combination with one or more other rare earth metal oxides.

In some embodiments, second layer 320 may include $Er_2O_3$, $Y_2O_3$, $Al_2O_3$, or $ZrO_2$. In some embodiments, second layer 320 is a multi-component material of at least one of $Er_xAl_yO_z$ (e.g., $Er_3Al_5O_{12}$), $Er_xZr_yO_z$, $Er_aZr_xAl_yO_z$, $Y_xEr_yO_z$, or $Er_aY_xZr_yO_z$ (e.g., a single phase solid solution of $Y_2O_3$, $ZrO_2$ and $Er_2O_3$). For each of these multi-component materials, the values of x, y, z and a may be positive numbers (e.g., integers or other values ranging from less than 1 to 20 or higher). Second layer 320 may also be one of $Y_3Al_5O_{12}$ (YAG), $Y_4Al_2O_9$ (YAM), $Y_2O_3$ stabilized $ZrO_2$ (YSZ), a solid solution of $Y_2O_3$—$ZrO_2$, or a ceramic compound comprising $Y_4Al_2O_9$ and a solid-solution of $Y_2O_3$—$ZrO_2$.

With reference to FIG. 3C, in some embodiments, the halogen resistant coating contains more than two layers. Specifically, the halogen resistant coating may include a sequence of alternating layers of a transition metal layer and the rare-earth metal-containing oxide layer, or may include a seed layer and a sequence of alternating layers of transition metals and/or rare earth metal-containing oxides.

Referring to FIG. 3C, an article 310 having a layer 316 may be inserted into a deposition chamber. The layer 316 may have been formed as set forth with reference to FIG. 3A or FIG. 3B. Article 310 may be introduced to one or more precursors 380 for a duration until the layer 316 or article 310 is fully adsorbed with the one or more additional precursors 380 to form an adsorption layer 322. Subsequently, article 310 may be introduced to a reactant 382 to react with adsorption layer 322 to grow a solid metal oxide layer 324. Accordingly, the metal oxide layer 324 is fully grown or deposited over layer 316 using ALD. In an example, precursor 380 may be a transition metal containing precursor (e.g., $TaCl_5$, $TaF_5$, $TaBr_5$) used in the first half cycle, and reactant 382 may be H used in the second half cycle. The transition metal layer 324 may be a first one of tantalum, titanium or niobium.

Article 310 having layer 316 and/or transition metal layer 324 may be introduced to one or more precursors 384 for a duration until a surface of layer 324 is fully adsorbed with the one or more precursors 384 to form an adsorption layer 326. Subsequently, article 310 may be introduced to a reactant 386 to react with adsorption layer 326 to grow an additional metal layer 328. Accordingly, the additional metal layer 328 is fully grown or deposited over layer 324 using ALD. In an example, precursor 384 may be a transition metal-containing precursor used in the first half cycle, and reactant 386 may be H used in the second half cycle.

As shown, the deposition of layer 324 and layer 328 may be repeated n times to form a stack 337 of alternating layers, where n is an integer value greater than 2. N may represent a finite number of layers selected based on the targeted thickness and properties. The stack 337 of alternating layers may be considered as a transition metal-containing layer containing multiple alternating sub-layers. Accordingly, precursors 380, reactants 384, precursors 384 and reactants 386 may be repeatedly introduced sequentially to grow or deposit additional alternating layers 330, 332, 334, 336, and so on. Each of the layers 324, 324, 330, 332, 334, 336, and so on may be very thin layers having a thickness of less than a single atomic layer to a few atomic layers. For example, an tantalum monolayer grown by $TaCl_5$ and H typically has a growth rate of about 0.16 to about 0.5 A/cycle.

The alternating layers 324-336 described above have a 1:1 ratio, where there is a single layer of a first metal for each single layer of a second metal. However, in other embodiments there may be other ratios such as 2:1, 3:1, 4:1, and so on between the different types of metal oxide layers. For example, two Ta layers may be deposited for every $Y_2O_3$ layer in an embodiment. Additionally, the stack 337 of alternating layers 324-336 have been described as an alternating series of two types of metal oxide layers. However, in other embodiments more than two types of metal oxide layers may be deposited in an alternating stack 337.

After the stack 337 of alternating layers has been formed, an anneal process may be performed to cause the alternating layers of different materials to diffuse into one another and form a complex oxide having a single phase or multiple phases. After the annealing process, the stack of alternating layers 337 may therefore become a single transition metal-containing layer 338.

In the embodiments described with reference to FIGS. 3A-3C, the surface reactions (e.g., half-reactions) are done sequentially, and the various precursors and reactants are not in contact in embodiments. Prior to introduction of a new precursor or reactant, the chamber in which the ALD process takes place may be purged with an inert carrier gas (such as nitrogen or air) to remove any unreacted precursor and/or surface-precursor reaction byproducts. The precursors may be different for each layer. In some embodiments, at least two precursors are used, in other embodiments at least three precursors are used and in yet further embodiments at least four precursors are used.

ALD processes may be conducted at various temperatures depending on the type of process. The optimal temperature range for a particular ALD process is referred to as the "ALD temperature window." Temperatures below the ALD temperature window may result in poor growth rates and non-ALD type deposition. Temperatures above the ALD temperature window may result in reactions taken place via a chemical vapor deposition (CVD) mechanism. The ALD temperature window may range from about 250° C. or less, or about 200° C. to about 250° C., or about 200° C. to about 400° C. In some embodiments, the ALD temperature window is from about 20° C. to about 400° C., or about 25° C. to about 300° C., or about 100° C. to about 400° C., or about 200° C. to 300° C. (e.g., when coating an gas line using $TaCl_5$).

The ALD process allows for a conformal halogen resistant coating having uniform thickness on articles and surfaces having complex geometric shapes, holes with high aspect ratios (e.g., pores), and three-dimensional structures. Sufficient exposure time of each precursor to the surface enables the precursor to disperse and fully react with the surfaces in their entirety, including all of its three-dimensional complex features. The exposure time utilized to obtain conformal ALD in high aspect ratio structures is proportionate to the square of the aspect ratio and can be predicted using modeling techniques. Additionally, the ALD technique is advantageous over other commonly used coating techniques because it allows in-situ on demand material synthesis of a particular composition or formulation without a lengthy and difficult fabrication of source materials (such as powder feedstock and sintered targets). In some embodiments ALD is used to coat articles having aspect ratios of about 3:1 to 300:1.

Figure 4A:
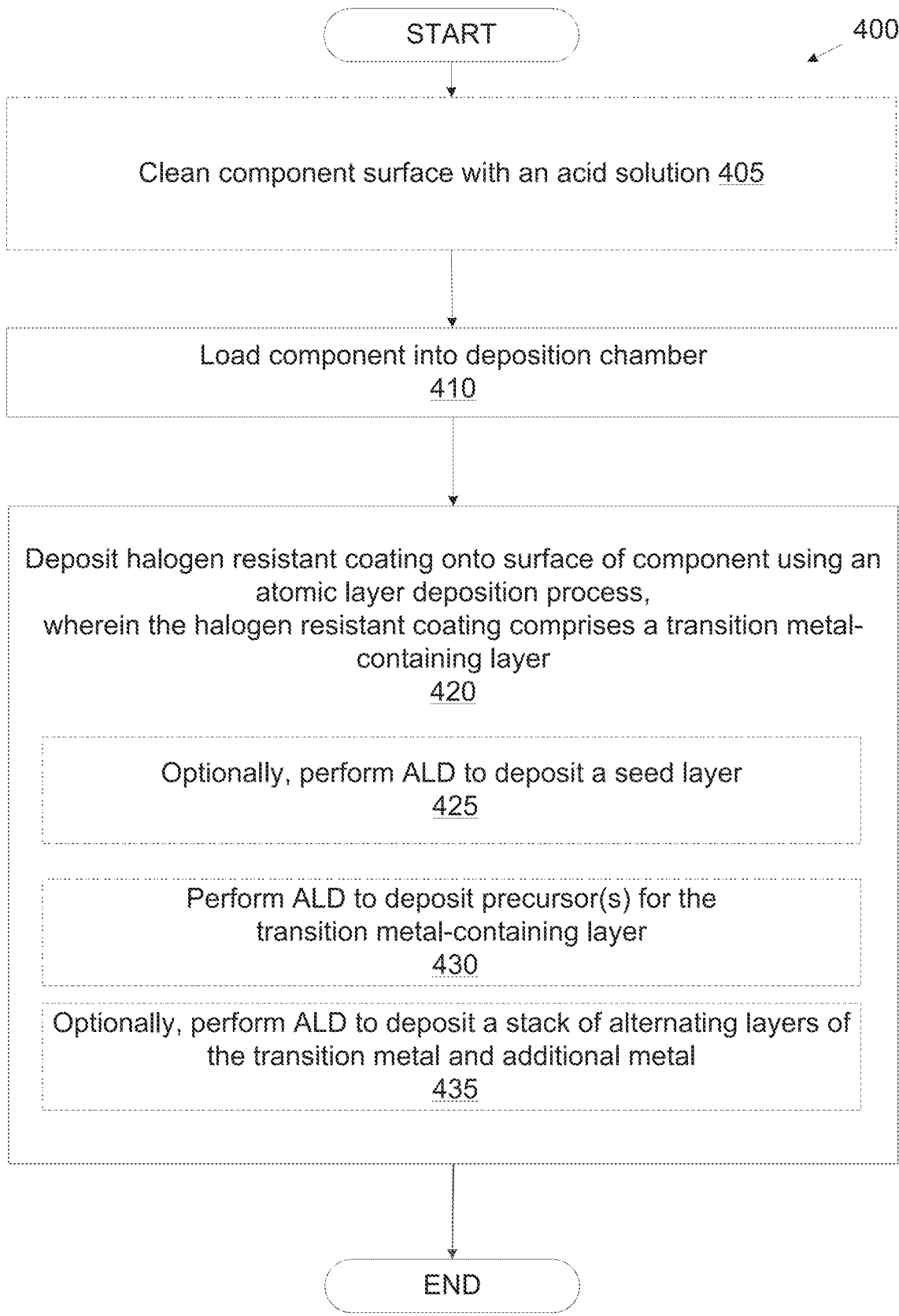
FIG. 4A illustrates a method for creating a halogen resistant coating using atomic layer deposition as described herein.

FIG. 4A illustrates a method 400 for forming a halogen resistant coating comprising a seed layer and a transition metal-containing layer on an article such as a process chamber component according to embodiments. The halogen resistant coating may be grown or deposited using ALD with a precursor for the seed layer and one or more precursors for deposition of a transition metal to form a transition metal-containing layer. Method 400 may be used to coat any articles including articles having aspect ratios of about 3:1 to about 300:1 (e.g., aspect ratios of 20:1, 50:1, 100:1, 150:1, and so on). The method may optionally begin by selecting a composition for the seed layer and for the transition metal-containing layer of the halogen resistant coating. The composition selection and method of forming may be performed by the same entity or by multiple entities.

The method may optionally include, at block 405, cleaning the component with an acid solution. In one embodiment, the component is placed in a bath of the acid solution. The acid solution may be a hydrofluoric acid (HF) solution, a hydrochloric acid (HCl) solution, a nitric acid ($HNO_3$) solution, or combination thereof in embodiments. The acid solution may remove surface contaminants from the article and/or may remove an oxide from the surface of the article. Cleaning the article with the acid solution may improve a quality of a coating deposited using ALD. In one embodiment, an acid solution containing approximately 0.1-5.0 vol % HF is used to clean chamber components made of quartz. In one embodiment, an acid solution containing approximately 0.1-20 vol % HCl is used to clean articles made of $Al_2O_3$. In one embodiment, an acid solution containing approximately 5-15 vol % $HNO_3$ is used to clean articles made of aluminum and other metals.

At block 410, the component is loaded into an ALD deposition chamber. At block 420, the method comprises depositing a halogen resistant coating onto a surface of the article using ALD. In one embodiment, at block 425, ALD is performed to deposit a seed layer as described above. In one embodiment, at block 430, ALD is performed to deposit a transition metal-containing layer alone or together with one or more other metals or metal oxides. For example, the transition metal-containing layer may include alloys of tantalum and/or titanium with one or more rare earth metals and/or transition metals. The alloying elements can include, but are not limited to, niobium, praseodymium and lanthanum. The alloy composition may include tantalum or titanium in combination with a niobium, praseodymium or lanthanum alloying element at an atomic ratio of about 50 at. % or less alloying element, or about 1 at. % to about 50 at. % alloying element, or about 5 at. % to about 50 at. % alloying element, or about 10 at. % to about 50 at. % alloying element, or about 20 at. % to about 50 at. % alloying element, or about 30 at. % to about 50 at. % alloying element or about 40 at. % to about 50 at. % alloying element. ALD is a very conformal process as performed in embodiments, which may cause the surface roughness of the halogen resistant coating to match a surface roughness of an underlying surface of the article that is coated. The halogen resistant coating may have a total thickness of about 20 nm to about 10 µm in some embodiments. In other embodiments, the halogen resistant coating may have a thickness of about 100 nm to about 2 micron. The halogen resistant coating may have a porosity of about 0% in embodiments, or may be porosity-free in embodiments, and may have a thickness variation of about +/−5% or less, +1-10% or less, or +/−20% or less.

In one embodiment, at block 435, ALD is performed to deposit a stack of alternating layers of the transition metal and an additional metal or metal oxide (e.g., a rare earth metal such as Y, Er or Zr). The additional metal may be a rare earth metal or rare earth metal oxide. The transition metal may be selected from tantalum, titanium, niobium, lanthanum, praseodymium and combinations thereof. In some embodiments, halogen resistant coatings as described herein may contain about 79.99 at. % to about 99.99 at. %, or about 89.99 at. % to about 99.99 at. % tantalum, titanium, niobium, lanthanum and/or praseodymium.

In embodiments where the halogen resistant coating is an alternating stack of a transition metal-containing layer and a rare earth metal-containing oxide layer, the rare earth metal-containing oxide may include yttrium, tantalum, zirconium and/or erbium. For example, the rare earth metal-containing oxide may be yttria ($Y_2O_3$), erbium oxide ($Er_2O_3$), zirconium oxide ($ZrO_2$), tantalum oxide ($Ta_2O_5$), and so on. The rare earth metal-containing oxide may also include aluminum mixed with one or more rare earth elements such as yttrium, zirconium and/or erbium. The additional oxide (or oxides) that may be co-deposited with the rare earth metal-containing oxide to form the a transition metal-containing layer may include zirconium oxide ($ZrO_2$), aluminum oxide ($Al_2O_3$), erbium oxide ($Er_2O_3$), or a combination thereof. A yttrium-containing oxide layer for the multi-layer halogen resistant coating may be, for example, $Y_xZr_yO_z$, $Y_aZr_xAl_yO_z$, $Y_xAl_yO_z$, or $Y_xEr_yO_z$. The yttrium-containing oxide may be yttria ($Y_2O_3$) with yttriaite having a cubic structure with space group Ia-3 (206). In one embodiment, the rare-earth metal-containing oxide layer is one of $Y_2O_3$, $Er_2O_3$, $Y_3Al_5O_{12}$ (YAG), $Er_3Al_5O_{12}$ (EAG), or $Y_4Al_2O_9$ (YAM). The rare-earth metal-containing oxide layer may also be $YAlO_3$ (YAP), $Er_4Al_2O_9$ (EAM), $ErAlO_3$ (EAP), a solid-solution of $Y_2O_3$—$ZrO_2$ and/or a ceramic compound comprising $Y_4Al_2O_9$ and a solid-solution of $Y_2O_3$—$ZrO_2$.

With reference to the solid-solution of $Y_2O_3$—$ZrO_2$, the rare-earth metal-containing oxide layer may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include 60-70 mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the ceramic compound comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0.1-60 mol % and $Al_2O_3$ in a range of 0.1-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0.1-20 mol % and $Al_2O_3$ in a range of 10-20 mol %. In another embodiment, the ceramic compound can include $Y_2O_3$ in a range of 60-80 mol %, $ZrO_2$ in a range of 0.1-10 mol % and $Al_2O_3$ in a range of 20-40 mol %. In another embodiment, the ceramic compound can include $Y_2O_3$ in a range of 40-60 mol %, $ZrO_2$ in a range of 0.1-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the rare-earth metal-containing oxide layer. In one embodiment, the alternative ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and SiO2 in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

Any of the aforementioned rare-earth metal-containing oxide layers may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

In embodiments where a rare earth metal containing oxide layer is included in a stack with the transition metal, rare earth metal-containing oxide materials that include yttrium may be used because yttrium-containing oxides generally have high stability, high hardness, and superior erosion resistant properties. For example, $Y_2O_3$ is one of the most stable oxides and has a standard Gibbs free energy of formation (Gf) of −1816.65 kJ/mol at 298 K, indicating the reactions of $Y_2O_3$ with most of the process chemicals are thermodynamically unfavorable under standard conditions. Accordingly, halogen resistant coatings having a transition metal layer in an alternating stack with a rare-earth metal-containing oxide layer, may also have a low erosion rate to many plasma and chemistry environments, such as an erosion rate of about 0 µm/hr when exposed to a direct $NF_3$ plasma chemistry at a bias of 200 Watts and 500° C. The halogen resistant coatings deposited in accordance with embodiments herein may also be resistant to cracking and delamination at temperatures up to about 400° C. in embodiments, or up to about 300° C. in embodiments, or up to about 250° C., or up to about 200° C., or from about 200° C. to about 400° C. in further embodiments. In contrast, coatings formed using conventional plasma spray coating or ion assisted deposition form cracks upon deposition and at temperatures at or below 200° C.

Examples of yttrium-containing oxide compounds that the halogen resistant coating may be formed of include $Y_2O_3$, $Y_xAl_yO_z$ (e.g., $Y_3Al_5O_{12}$), $Y_xZr_yO_z$, $Y_aZr_xAl_yO_z$, or $Y_xEr_yO_z$. The yttrium content in the halogen resistant coating may range from about 0.1 at. % to close to 50 at. %. For yttrium-containing oxides, the yttrium content may range from about 0.1 at. % to close to 100 at. % and the oxygen content may range from about 0.1 at. % to close to 100 at. %.

Examples of erbium-containing oxide compounds that the halogen resistant coating may be formed of include $Er_2O_3$, $Er_xAl_yO_z$ (e.g., $Er_3Al_5O_{12}$), $Er_xZr_yO_z$, $Er_aZr_xAl_yO_z$, $Y_xEr_yO_z$, and $Er_aY_xZr_yO_z$ (e.g., a single phase solid solution of $Y_2O_3$, $ZrO_2$ and $Er_2O_3$). The erbium content in the halogen resistant coating may range from about 0.1 at. % to close to 100 at. %. For erbium-containing oxides, the erbium content may range from about 0.1 at. % to close to 100 at. % and the oxygen content may range from about 0.1 at. % to close to 100 at. %.

Advantageously, $ZrO_2$ may be combined with $Y_2O_3$ and/or $Er_2O_3$ to form a single phase solid solution containing a mixture of the $ZrO_2$, $Y_2O_3$ and $Er_2O_3$ (e.g., $Er_aY_xZr_yO_z$). The solid solution of $Y_aEr_xZr_yO_z$ may have a cubic, hexagonal, tetragonal and/or cubic fluorite structure. The solid solution of $Y_aEr_xZr_yO_z$ may contain over 0 mol % to 60 mol % $ZrO_2$, over 0 mol % to 99 mol % $Er_2O_3$, and over 0 mol % to 99 mol % $Y_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Er_2O_3$ and/or $Y_2O_3$ that may be used include 10 mol %, 20 mol %, 30 mol %, 40 mol %, 50 mol %, 60 mol %, 70 mol %, 80 mol %, and 90 mol %.

Halogen resistant coatings containing $Y_aZr_xAl_yO_z$ may have over 0% to 60 mol % $ZrO_2$, over 0 mol % to 99 mol % $Y_2O_3$, and over 0 mol % to 60 mol % $Al_2O_3$. Some notable amounts of $ZrO_2$ that may be used include 2 mol %, 5 mol %, 10 mol %, 15 mol %, 20 mol %, 30 mol %, 50 mol % and 60 mol %. Some notable amounts of $Y_2O_3$ that may be used include 10 mol %, 20 mol %, 30 mol %, 40 mol %, 50 mol %, 60 mol %, 70 mol %, 80 mol %, and 90 mol %. Some notable amounts of $Al_2O_3$ that may be used include 2 mol %, 5 mol %, 10 mol %, 20 mol %, 30 mol %, 40 mol %, 50 mol % and 60 mol %. In one example, the halogen resistant coating of $Y_aZr_xAl_yO_z$ contains 42 mol % $Y_2O_3$, 40 mol % $ZrO_2$ and 18 mol % $Y_2O_3$ and has a lamellar structure. In another example, the halogen resistant coating of $Y_aZr_xAl_yO_z$ contains 63 mol % $Y_2O_3$, 10 mol % $ZrO_2$ and 27 mol % $Er_2O_3$ and has a lamellar structure.

Figure 4B:
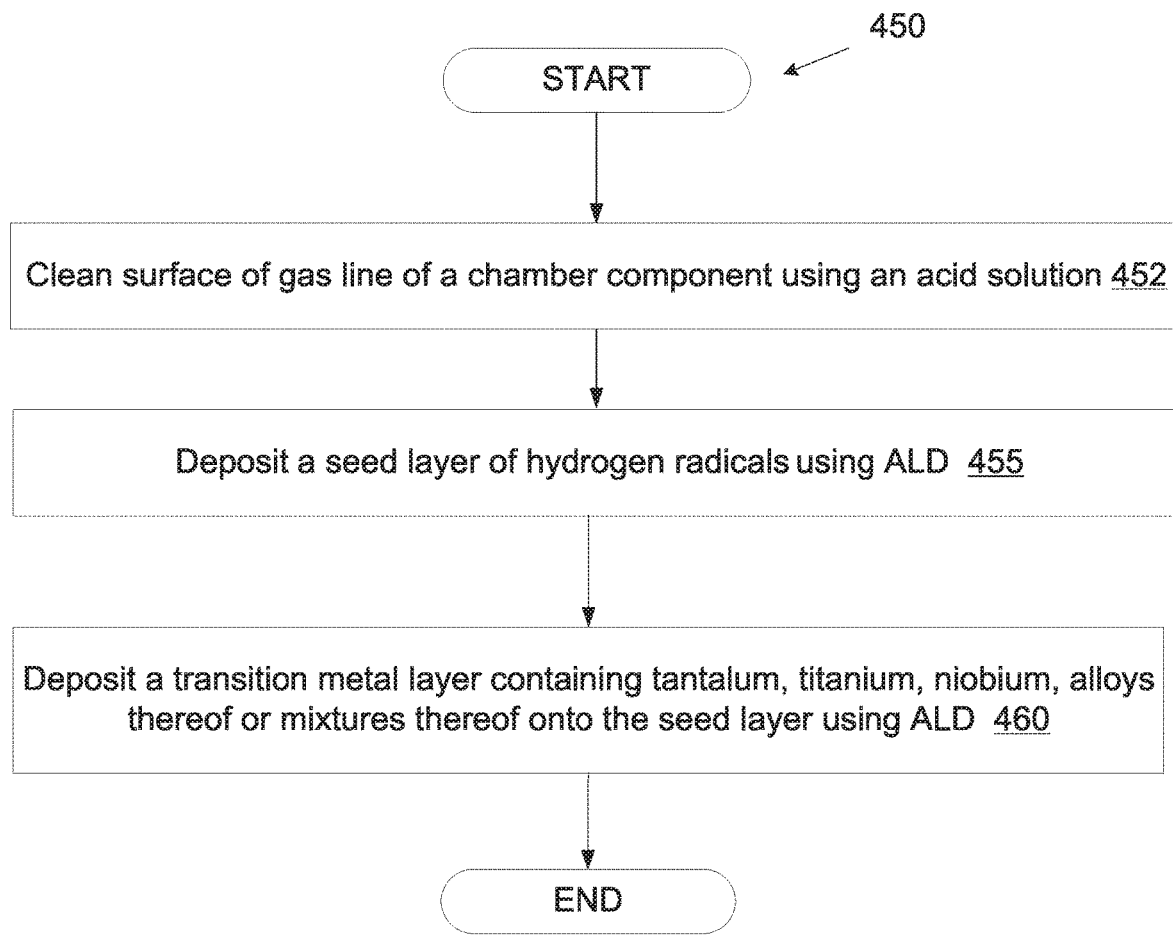
FIG. 4B illustrates a method for creating a halogen resistant coating using atomic layer deposition as described herein.

FIG. 4B illustrates a method 450 for forming a yttrium-containing oxide halogen resistant coating on an aluminum article (e.g., Al6061, or Al6063) such as a process chamber component according to an embodiment. The method may optionally begin by selecting compositions for the halogen resistant coating. The composition selection and method of forming may be performed by the same entity or by multiple entities.

At block 452 of method 450, a surface of the article (e.g., of the process chamber component) is cleaned using an acid solution. The acid solution may be any of the acid solutions described above with reference to block 405 of method 400. The article may then be loaded into an ALD deposition chamber.

Pursuant to block 455, the method comprises depositing a seed layer of hydrogen radicals onto a surface of a component via ALD. The seed layer may have a thickness of about 10 nm to about 1.5 μm. Pursuant to block 460, the method further comprises depositing a transition metal layer containing tantalum, titanium, niobium, alloys thereof, alloys of tantalum or titanium with a rare earth metal or mixtures thereof.

The above described methods in FIGS. 4A and 4B may also be implemented using a pulsed CVD process. In the pulsed CVD process, the two precursors (i.e., the transition metal-containing precursor and the reactant) react between themselves and then the resultant material reacts with the surface of the article having the optional seed layer. A pulsed CVD process improves upon a standard CVD process by reducing the thermal decomposition of a single metal precursor.

The following examples are set forth to assist in understanding the embodiments described herein and should not be construed as specifically limiting the embodiments described and claimed herein. Such variations, including the substitution of all equivalents now known or later developed, which would be within the purview of those skilled in the art, and changes in formulation or minor changes in experimental design, are to be considered to fall within the scope of the embodiments incorporated herein. These examples may be achieved by performing method 300 or method 350 described above.

Example 1—Comparison of a Tantalum Coating with a Nickel Coating when Exposed to Trichlorosilane Chemical vapor deposition was used to coat an article with tantalum and electroless nickel plating (ENP) was used to coat a separate article with nickel. Each coated article was then exposed to trichlorosilane (TCS) at a pressure of 8 torr and a temperature of 400° C. for a period of 16 hours (i.e., an accelerated test to mimic Olympia thermal pie chemistry).

Figure 5A:
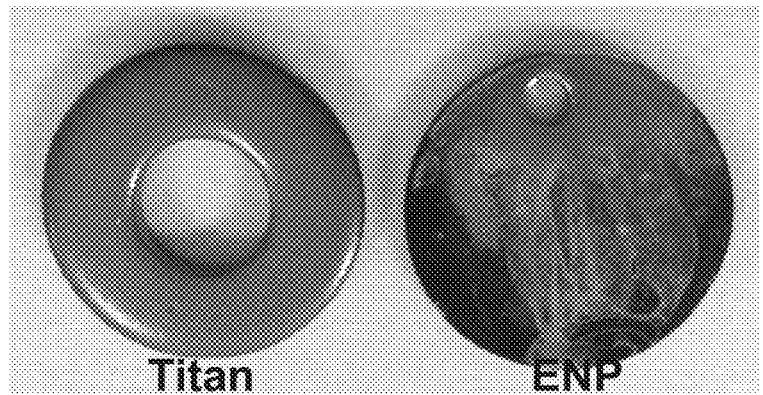
FIG. 5A depicts a tantalum coated component and a nickel coated component after exposure to trichlorosilane.
Figure 5B:
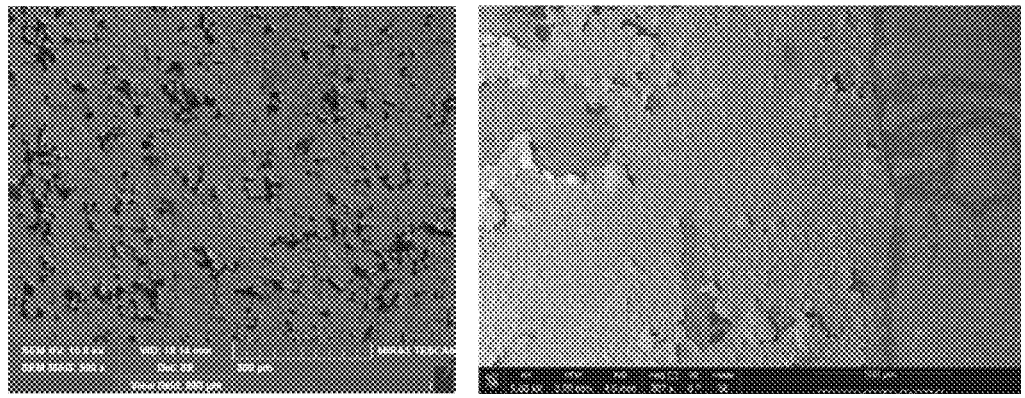
FIG. 5B depicts a tantalum coated component and a nickel coated component after exposure to trichlorosilane.

As shown in FIGS. 5A and 5B (the article on the right hand side), after exposure, the nickel coating demonstrated severe discoloration, voiding and peeling. Additionally, as measured by x-ray photoelectron spectroscopy (XPS), a silicate layer ($NiSi_xO_y$) of about 300 nm to about 400 nm formed on portions of the nickel coating. Nickel silicide (NiSi) was present in a subsurface layer.

Also as shown in FIGS. 5A and 5B (the article on the left hand side), there was no obvious surface deterioration of the tantalum coating. A thin oxide layer of about 10 nm to about 20 nm formed on the surface of the tantalum coating following exposure to TCS. No silicon (Si) or chlorine (Cl) was detected by electron energy loss spectroscopy (EELS), although trace amounts were present on the top few nm of the tantalum coating as measured by XPS.

Figure 6:
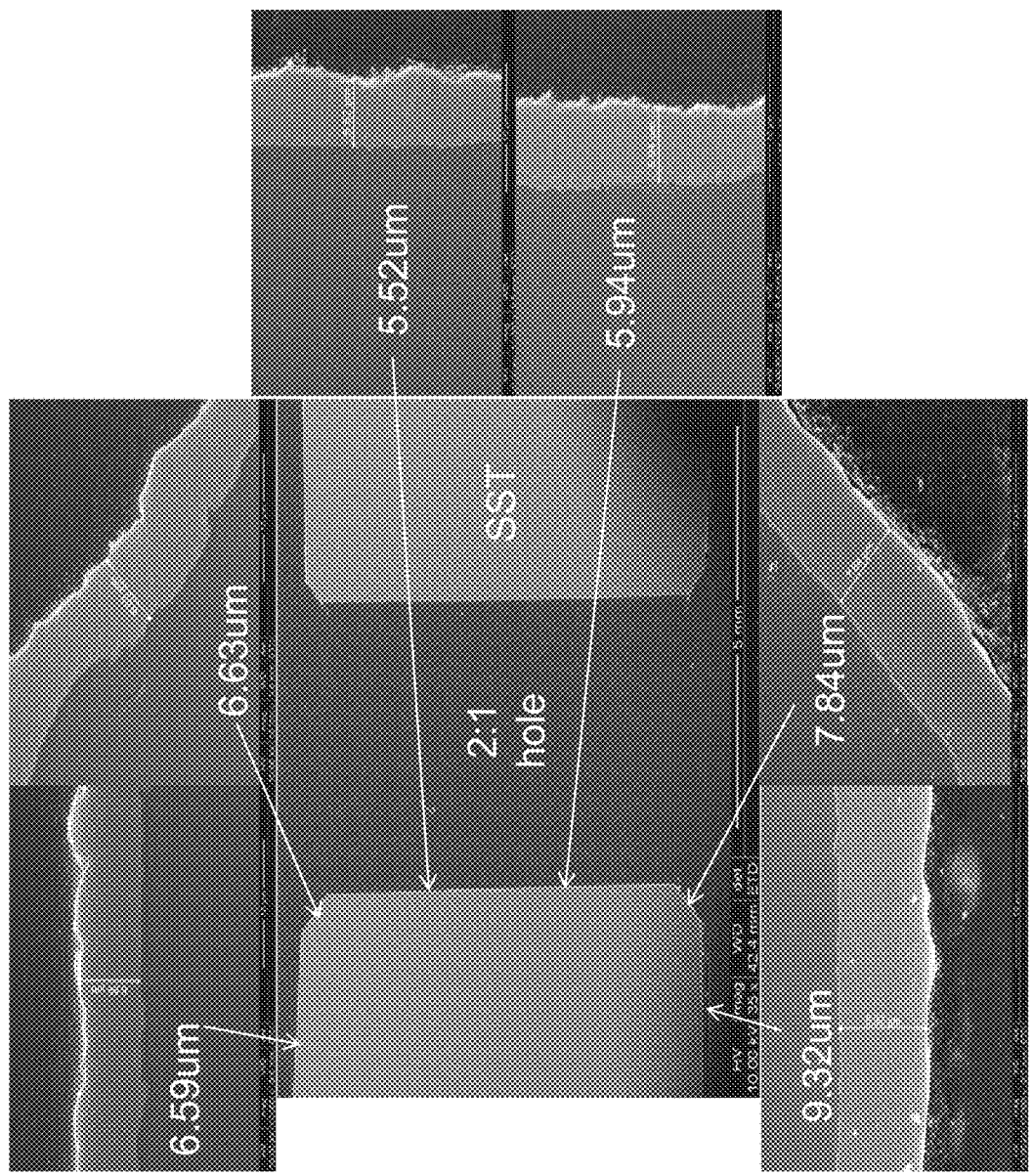
FIG. 6 is an image of a conformal tantalum coating in a hole feature.

Example 2—Conformality, Surface Roughness and Grain Orientation of Tantalum Coatings Chemical vapor deposition was used to coat a substrate with tantalum. As shown in FIG. 6, the tantalum coating within a hole having an aspect ratio of 2:1 (depth:width) was very conformal. The tantalum coating was thin enough to not cover the hole and uniformly coated all surface features. The CVD technique can coat a feature with an aspect ratio up to 10:1 without a fitting to provide forced flow into the feature (e.g., a pipe or tube). Features having aspect ratios higher than 10:1 needed the use of a force flow fixture to direct the precursor within the feature.

Figure 7:
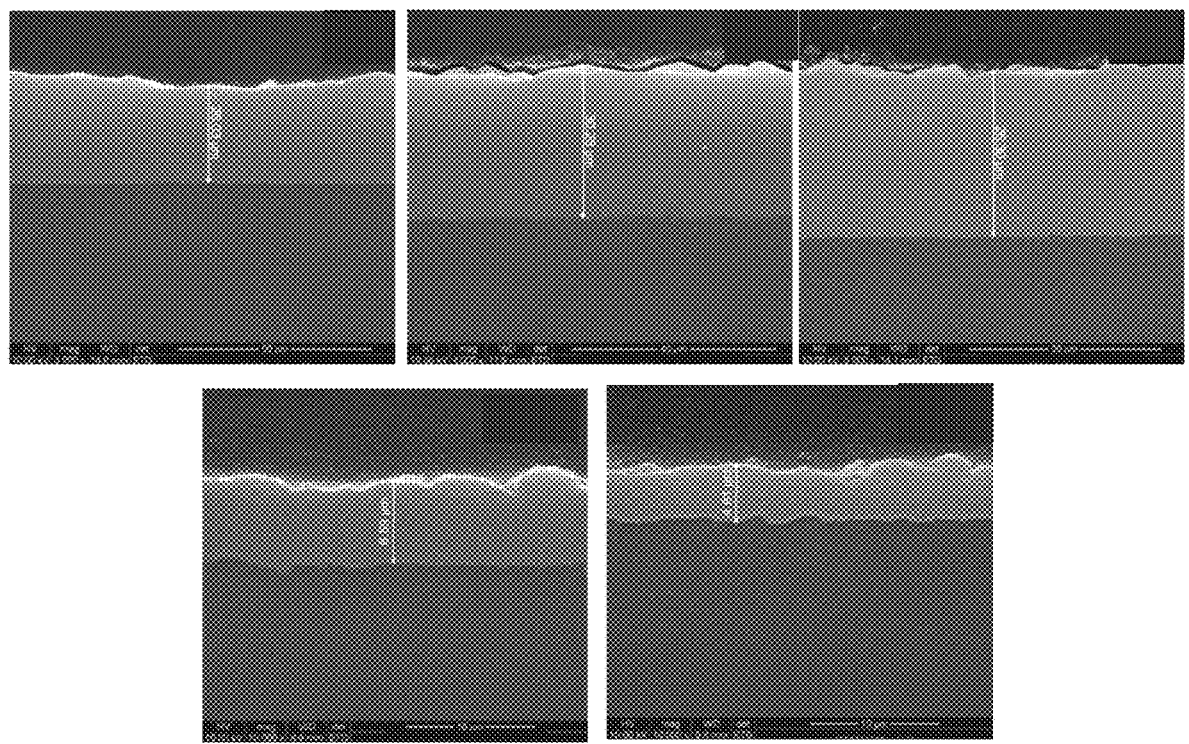
FIG. 7 depicts scanning electron microscopy images showing surface roughness of a tantalum coating at varying thicknesses.
Figure 8:
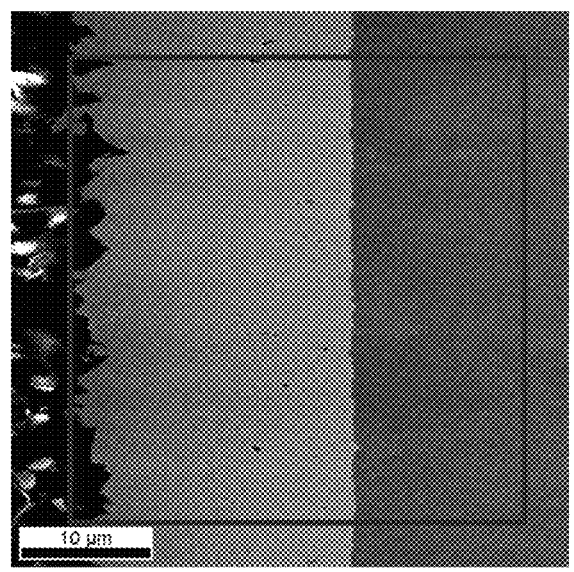
FIG. 8 is an electron backscatter diffraction image that shows columnar grains in a tantalum film.

As shown in FIG. 7, the surface roughness of the tantalum coating varied with varying film thicknesses. FIG. 8 shows the grain orientation for sample 12 depicted in FIG. 7. The grains of the tantalum layer were columnar and they grew larger with increasing thickness. In the stainless steel substrate on which the tantalum coating was applied, both fcc (γ phase) and bcc (α phase similar to bcc Ta) were observed. Table 1 shows the purity levels of various elements in the tantalum coating.

TABLE 1

Purity levels in tantalum coating

| Element | Ta (ppm) | Element | Ta (ppm) | Element | Ta (ppm) |
|---|---|---|---|---|---|
| Li | <1 | Se | <1 | Eu | <1 |
| Be | <1 | Rb | <1 | Gd | <1 |
| B | <1 | Sr | <1 | Tb | <1 |
| Na | <10 | Y | <1 | Dy | <1 |
| Mg | <1 | Zr | <1 | Ho | <1 |
| Al | <1 | Nb | 19 | Er | <1 |
| Si | <10 | Mo | <1 | Tm | <1 |
| P | <10 | Ru | <1 | Yb | <1 |
| K | <10 | Rh | <1 | Lu | <1 |
| Ca | <10 | Pd | <1 | Hf | <1 |
| Sc | <1 | Ag | <1 | Ta | Matrix |
| Ti | <1 | Cd | <1 | W | 55 |
| V | <1 | In | <1 | Re | <1 |
| Cr | <1 | Sn | <1 | Os | <1 |
| Mn | <1 | Sb | <1 | Ir | <1 |
| Fe | <10 | Te | <1 | Pt | <1 |
| Co | <1 | Cs | <1 | Au | <100 |
| Ni | <1 | Ba | <1 | Hg | <10 |
| Cu | <1 | La | <1 | Tl | <1 |
| Zn | <1 | Ce | <1 | Pb | <1 |
| Ga | <1 | Pr | <1 | Bi | <1 |
| Ge | <1 | Nd | <1 | Th | <1 |
| As | <1 | Sm | <1 | U | <1 |

The preceding description sets forth numerous specific details such as examples of specific systems, components, methods, and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the invention. Thus, the specific details set forth are merely exemplary. Particular implementations may vary from these exemplary details and still be contemplated to be within the scope of the invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A chamber component, comprising:
a halogen resistant coating on a surface of a portion of the chamber component, wherein the portion has an aspect ratio of length to diameter or depth to width of about 10:1 to about 300:1, wherein the halogen resistant coating comprises:
a seed layer formed of hydrogen radicals, wherein the seed layer has a thickness of about 1 nm to about 1.5 μm;
a transition metal-containing layer having a thickness of about 10 nm to about 1.5 μm, wherein the transition metal-containing, layer comprises a transition metal material selected from a the group consisting of tantalum, titanium, niobium, alloys thereof, alloys of tantalum or titanium with a rare-earth metal and combinations thereof, the transition metal-containing layer comprising:
a stack of alternating layers of the transition metal material and the rare-earth metal, wherein:
layers of the transition metal material in the stack of alternating layers each has a thickness of about 5-100 angstroms; and
layers of the rare earth metal in the stack of alternating layers each has a thickness of about 1-4 angstroms, wherein the layers of the rare earth metal prevent crystal formation in the layers of the transition metal material; and
an intermediate layer between. the seed layer and the transition metal-containing layer, the intermediate layer comprising an interdiffused solid state phase;
wherein the halogen resistant coating uniformly covers the portion.

2. The component of claim 1, wherein the component is selected from the group consisting of a plasma generation unit, a shower head, a diffuser, a nozzle, gas distribution hub assembly and a gas line.

3. The component of claim 1, wherein the portion is an interior surface of a as line, or wherein the portion is a trough.

4. The component of claim 1, wherein the transition metal-containing layer further comprises the rare-earth metal, which is selected from the group consisting of yttrium (Y), cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm) and ytterbium (Yb).

5. The component of claim 1, wherein the transition metal-containing layer comprises a trace material selected from the group consisting of tantalum chloride, tantalum fluoride, tantalum bromide, tantalum iodide and tantalum oxide.

6. The component of claim 1, wherein the stack of alternating layers has a total thickness of about 10 nm-1.5 um.

7. The component of claim 1, wherein the halogen resistant coating is pin-hole free.

8. The component of claim 2, wherein the component is a plasma generation unit.

9. The component of claim 2, wherein the component is a shower head.

10. The component of claim 2, wherein the component is a diffuser.

11. The component of claim 2, wherein the component is a nozzle.

12. The component of claim 2, wherein the component is a gas distribution hub assembly.

13. The component of claim 2, wherein the component is a gas line.

14. The component of claim 4, the rare-earth metal comprises yttrium (Y).

15. The component of claim 4, wherein the rare-earth metal comprises erbium (Er).

16. The component of claim 4, wherein the rare-earth metal comprises cerium (Ce).

17. The component of claim 1, wherein the transition metal material comprises an alloy of tantalum or titanium with the rare-earth metal.

18. The component of claim 17, wherein the rare-earth metal comprises niobium, praseodymium or lanthanum.

19. The component of claim 18, wherein the alloys of tantalum or titanium contain about 50 at. % or legs of the rare-earth metal.

20. The component of claim 18, wherein the alloys of tantalum or titanium contain about 1 at. % to about 50 at. % of the rare-earth metal.

\* \* \* \* \*